United States Patent [19]

Higashide

[11] Patent Number: 5,621,461
[45] Date of Patent: Apr. 15, 1997

[54] SOLID STATE IMAGE DEVICE WITH GATE ELECTRODES HAVING LOW RESISTANCE AND A METHOD OF PRODUCING THE SAME

[75] Inventor: Hiroshi Higashide, Tenri, Japan

[73] Assignee: Sharp Kabushiki Kaisha, Osaka, Japan

[21] Appl. No.: 523,031

[22] Filed: Sep. 1, 1995

Related U.S. Application Data

[63] Continuation of Ser. No. 288,937, Aug. 10, 1994, abandoned.

[30] Foreign Application Priority Data

Oct. 5, 1993 [JP] Japan .................................... 5-249509

[51] Int. Cl.⁶ .................................................. H04N 5/335
[52] U.S. Cl. .......................... 348/302; 348/311; 257/232
[58] Field of Search ..................... 348/302, 311, 348/317, 294; 257/233, 250, 380, 412, 638, 775, 232; 437/3; H04N 5/335

[56] References Cited

U.S. PATENT DOCUMENTS

| | | | |
|---|---|---|---|
| 4,845,544 | 7/1989 | Shimizu | 257/71 |
| 5,028,972 | 7/1991 | Watanabe et al. | 257/30 |
| 5,080,933 | 1/1992 | Grupen-Shemansky et al. | 427/255.1 |
| 5,234,780 | 8/1993 | Nitayama et al. | 430/5 |
| 5,239,412 | 8/1993 | Naka et al. | 359/619 |
| 5,422,285 | 6/1995 | Ishibe | 437/3 |

FOREIGN PATENT DOCUMENTS 2-066949A   3/1990   Japan .

*Primary Examiner*—Wendy Garber
*Assistant Examiner*—Andrew B. Christensen
*Attorney, Agent, or Firm*—David G. Conlin; Milton Oliver

[57] ABSTRACT

A solid state image device including: a plurality of photoelectric converting elements arranged in a matrix pattern along a first and a second direction in a semiconductor substrate; a plurality of electric charge transfer regions for receiving electric charges from the photoelectric converting elements and for transferring the electric charges toward the first direction, the electric charge transfer regions being provided adjacent to the plurality of photoelectric converting elements in the semiconductor substrate and extending along the first direction; and a plurality of gate electrodes for applying a voltage to the electric charge transfer regions to transfer the electric charge from the photoelectric converting elements to the electric charge transfer regions, and to transfer the electric charges toward the first direction, each of the gate electrodes having a plurality of transfer electrode portions provided over the electric charge transfer regions and a plurality of clip electrode portions electrically connecting the plurality of the transfer electrode portions to each other along the second direction, the plurality of the clip electrode portions having a greater thickness than that of the plurality of the transfer electrode portions.

7 Claims, 10 Drawing Sheets

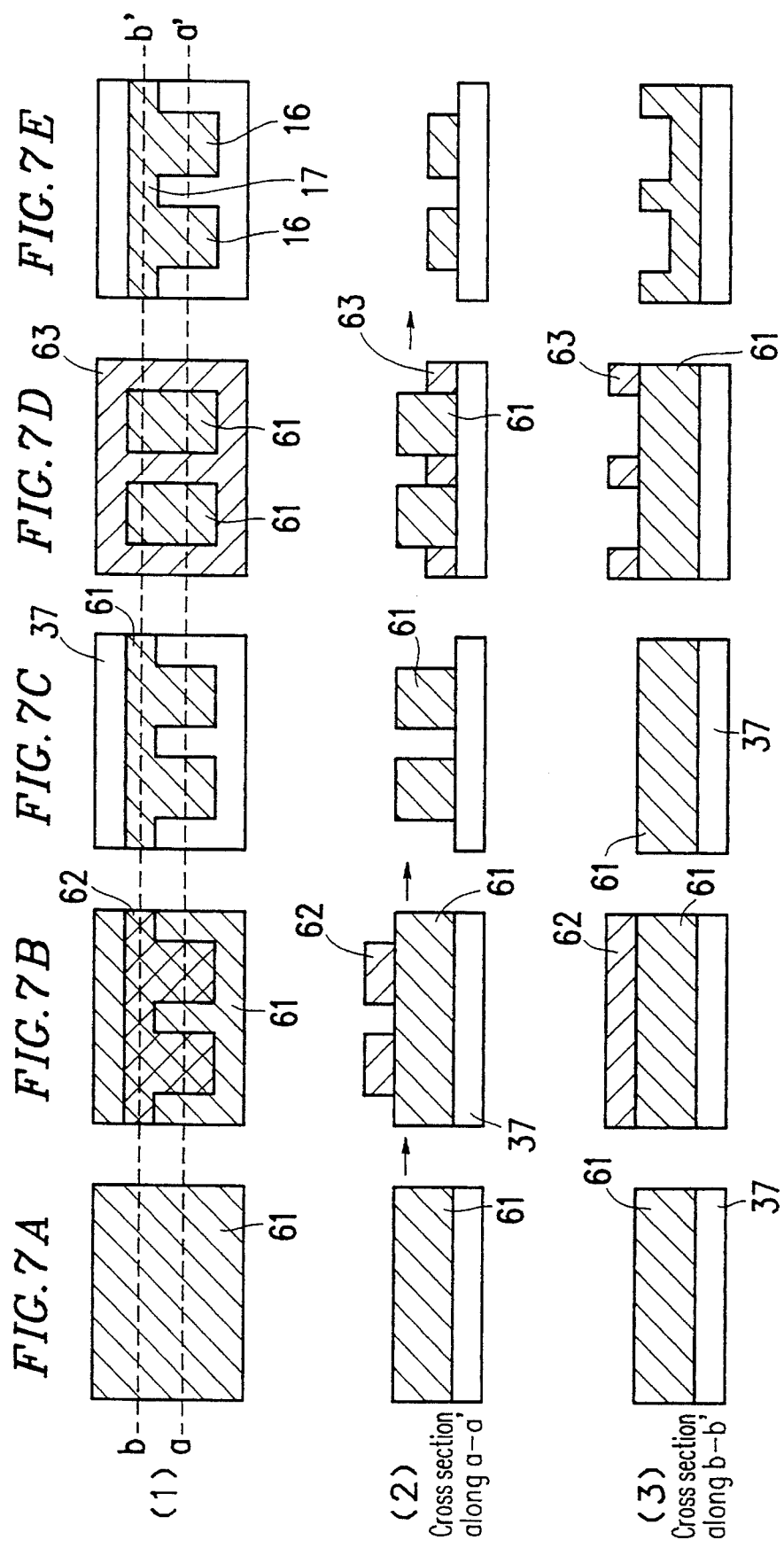

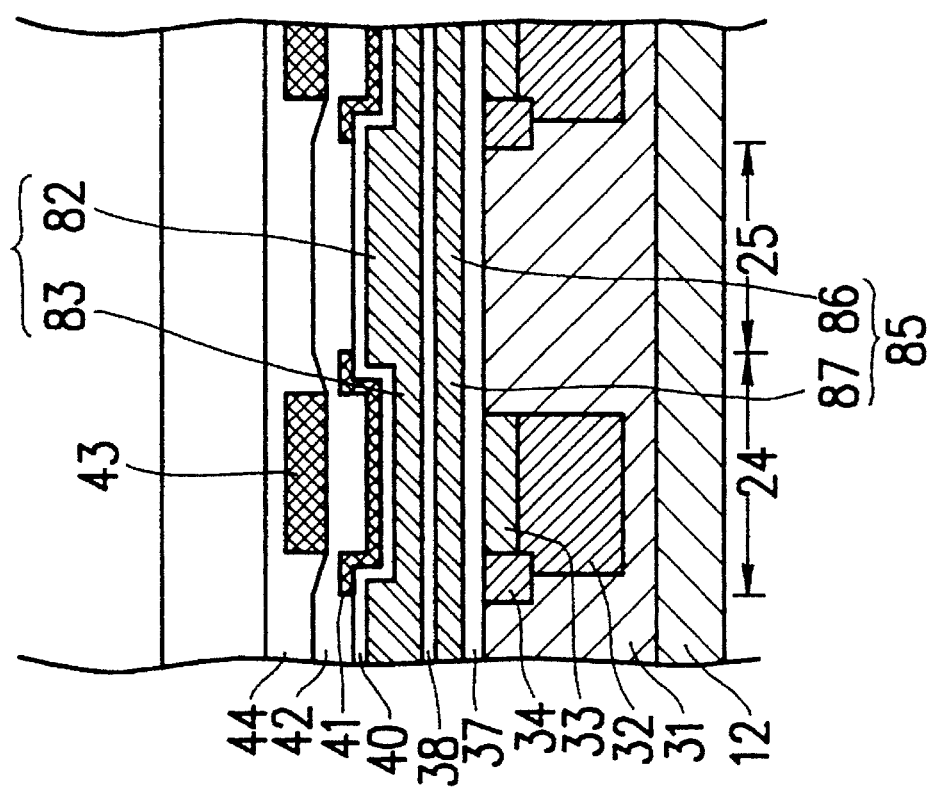
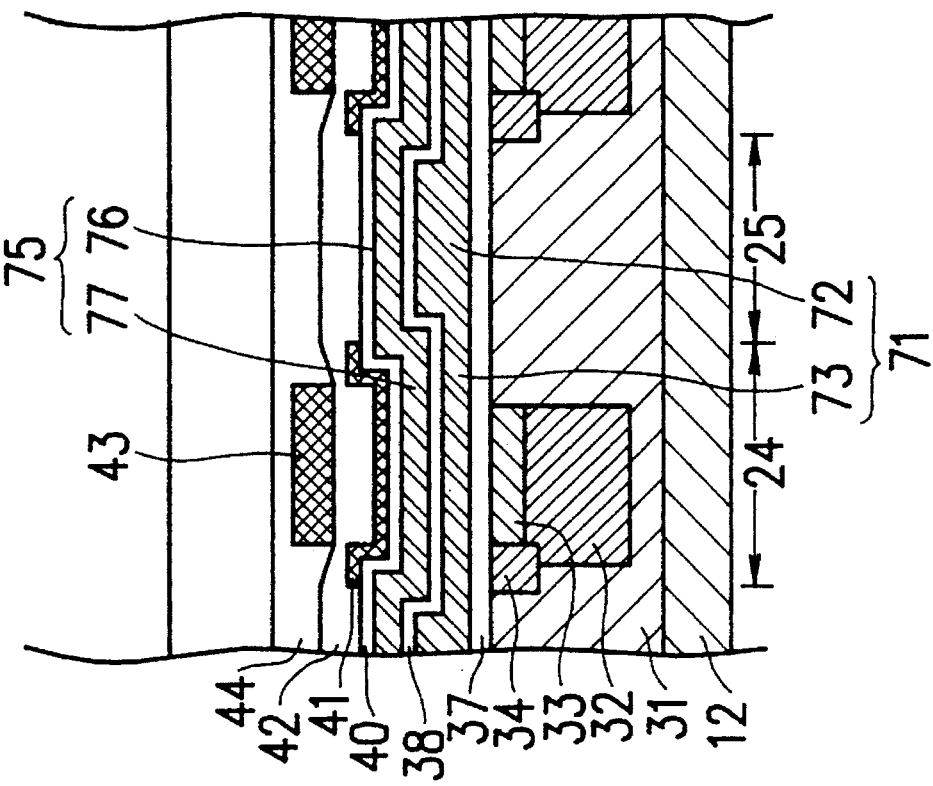

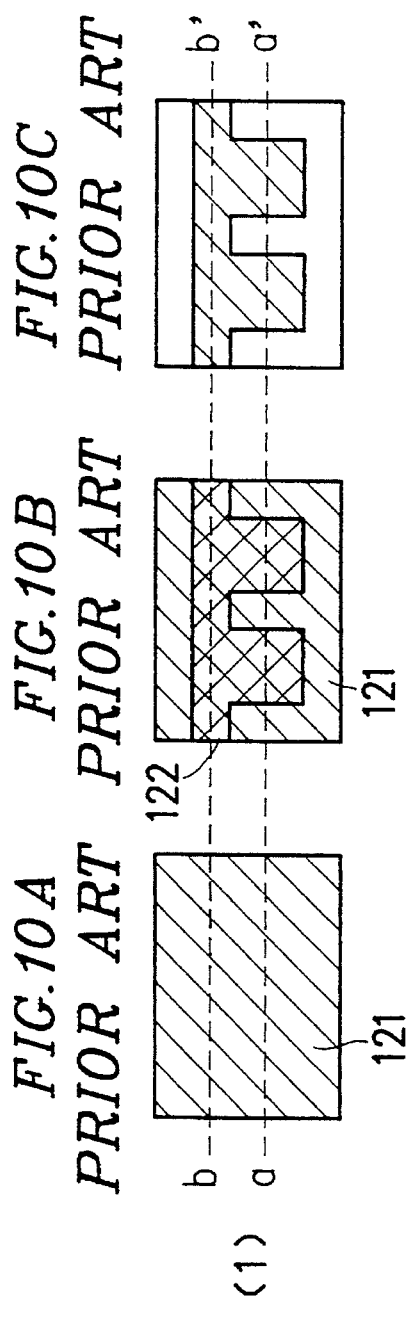

SOLID STATE IMAGE DEVICE WITH GATE ELECTRODES HAVING LOW RESISTANCE AND A METHOD OF PRODUCING THE SAME

This application is a continuation of application Ser. No. 08/288,937 filed on Aug. 10, 1994, now abandoned.

BACKGROUND OF THE INVENTION

1. Field of the Invention

The present invention relates to a solid state image device and a method of producing the same, and more particularly to a solid state image device which is driven at a high speed for adapting to HDTV (High Definition TV) systems or the like, and a method of producing the same.

2. Description of the Related Art

An experimental TV program for a HDTV system has been broadcast in recent years, and there has been an increase in demand for promptly commercializing the devices for HDTV systems. An HDTV camera is one of those devices.

Since HDTV cameras commercially available today use an image tube, they have the problems due to these image tubes. Specifically, the image tube tends to break when it is subjected to a large external force, or when it is vibrated. It is also difficult to produce a smaller image tube. Thus, the development of an HDTV camera employing a solid state image device which can overcome these problems is desirable. Because conventional solid state image devices have the following problems, they are not suitable for HDTV cameras.

FIG. 9 shows a partial plan view of a conventional solid state image device 100. In the solid state image device 100, photodiodes 101 for converting light into electric charges are formed in a matrix pattern along x and y directions in a semiconductor substrate 102. Vertical transfer regions 103 extending along the y direction are formed between the photodiodes 101 in the semiconductor substrate 102. The regions where the photodiode 101 and the vertical transfer region 103 are provided are referred to as a photosensitive portion and a vertical transfer portion, respectively. The region between two adjacent photosensitive portions along the y direction is referred to as a clip portion.

A plurality of first Gate electrodes 104 shown by dotted lines and a plurality of second gate electrodes 105 shown by solid lines, both in a comb shape, are provided between the photodiodes 101 over the semiconductor substrate 102.

Each of the first gate electrodes 104 includes transfer electrode portions 106 provided on the vertical transfer regions 103 through an insulating film, and clip electrode portions 107 for connecting the vertical transfer electrode portions 106 to each other in the x direction. Similarly, each of the second Gate electrodes 105 includes vertical transfer electrode portions 108 provided on the vertical transfer regions 103 through an insulating film, and clip electrode portions 109 for connecting the vertical transfer electrode portions 108 to each other in the x direction.

After electric charges are accumulated in photodiodes 101, each of the electric charges is transferred to the vertical transfer region 103 as indicated with an arrow 110 by a driving pulse voltage applied to the second gate electrodes 105. Then, the electric charge is transferred in the vertical transfer region 103 in the direction indicated by an arrow 111 by driving pulse voltages applied to the first gate electrodes 104 and the second gate electrodes 105.

To apply the solid state image device 100 for an HDTV camera, it is necessary that the solid state image device 100 has a large number of pixels, such as 1.3 or 2.0 million, and is driven at a high speed. Specifically, the electric charges accumulated in the photodiodes 101 need to be transferred at a high speed by driving pulse voltages applied to the first and second gate electrodes 104 and 105.

However, since the size of the solid state image device 100 increases as the number of the pixels increases, the first and second electrodes 104 and 105 become longer, the effect of the resistance of the gate electrodes themselves become significant. Thus, since the middle portions of the first and second electrodes 104 and 105 are most distant from both ends of each electrode, the effect of the resistances of the gate electrodes to which driving pulse voltages are applied is significant in these portions. Therefore, the pulse width of a driving pulse voltage decreases in the middle portions of the gate electrodes, and the maximum amount of electric charge transfer is disadvantageously reduced.

Conventional gate electrodes are made integrally by forming polysilicon films, each of which has a uniform film thickness, on a semiconductor substrate, and etching them into a predetermined shape. More specifically, after the deposition of a polysilicon film 121 having a thickness of about 450 nm on an insulating film 120 as shown in FIG. 10A, a resist pattern 122 is formed on the polysilicon film 121 as shown in FIG. 10B. Then, the polysilicon film 121 is etched using the resist pattern 122 as a mask, and the first gate electrodes 104 are formed by removing the resist pattern 122. As a result, the first gate electrodes 104 of the conventional art having a thickness of 450 nm is formed on the entire region which has been subjected to the formation steps. Since the polysilicon has a high resistance, the problem described above is significant.

SUMMARY OF THE INVENTION

The solid state image device of this invention includes: a plurality of photoelectric converting elements arranged in a matrix pattern along a first and a second direction in a semiconductor substrate; a plurality of electric charge transfer regions for receiving electric charges from the photoelectric converting elements and for transferring the electric charges toward the first direction, the electric charge transfer regions being provided adjacent to the plurality of photoelectric converting elements in the semi-conductor substrate and extending along the first direction; and a plurality of gate electrodes for applying a voltage to the electric charge transfer regions to transfer the electric charge from the photoelectric converting elements to the electric charge transfer regions, and to transfer the electric charges toward the first direction, each of the gate electrodes having a plurality of transfer electrode portions provided over the electric charge transfer regions and a plurality of clip electrode portions electrically connecting the plurality of the transfer electrode portions to each other along the second direction, the plurality of the clip electrode portions having a greater thickness than that of the plurality of the transfer electrode portions.

In one embodiment of the invention, the solid state image device further includes light shielding films, provided over only the electric charge transfer regions, for shielding the electric charge transfer regions from incident light.

In another embodiment of the invention, the gate electrodes are made of polysilicon.

According to another aspect of the invention, a method of producing a solid state image device having a plurality of photoelectric converting elements arranged in a matrix pattern along a first and a second directions in a semiconductor substrate is provided. The method includes the steps of: forming a plurality of electric charge transfer regions for receiving electric charges from the photoelectric converting elements and for transferring the electric charges toward the first direction, the electric charge transfer regions being provided adjacent to the plurality of photoelectric converting elements in the semiconductor substrate and extending along the first direction; and forming a plurality of gate electrodes for applying a voltage to the electric charge transfer regions to transfer the electric charge from the photoelectric converting elements to the electric charge transfer regions, and to transfer the electric charges toward the first direction, each of the gate electrodes having a plurality of transfer electrode portions provided over the electric charge transfer regions and a plurality of clip electrode portions electrically connecting the plurality of the transfer electrode portions to each other along the second direction, the plurality of the clip electrode portions having a greater thickness than that of the plurality of the transfer electrode portions.

In one embodiment of the invention, the step of forming the gate electrodes includes the steps of: depositing polysilicon on the entire surface of a semiconductor substrate to form a polysilicon film having a pattern for the gate electrodes; forming a resist pattern defining the transfer electrode portions on a surface of the polysilicon film; and etching the polysilicon film using the resist pattern as a mask.

In the solid state image device of the invention, since the gate electrodes formed of polysilicon is thicker in the clip portion than in the other portions, the reduction of the pulse width in the middle portions of the gate electrodes is suppressed even when a driving pulse voltage is applied on the gate electrodes made of polysilicon from both sides of a pixel portion.

Moreover, light shielding metal films are formed only in a transfer portion while the gate electrodes are made thicker except in the transfer portion. Therefore, the final thicknesses of the regions except the transfer region do not exceed the thickness of the vertical transfer portion. With the structure of the solid state image device of the invention, the waveform rounding (reduction of the maximum amount of electric charge transfer) can be suppressed and driving at a high speed can be realized without reducing the relative sensitivity when the f value of a camera lens is small.

Thus, the invention described herein makes possible the advantage of providing a solid state image device and a production method thereof wherein the reduction of the pulse width in the middle portions of the gate electrodes are suppressed even when a driving pulse voltage is applied on polysilicon electrodes from both sides of a pixel portion.

This and other advantages of the present invention will become apparent to those skilled in the art upon reading and understanding the following detailed description with reference to the accompanying figures.

BRIEF DESCRIPTION OF THE DRAWINGS

FIGS. 7A through 7E show formation steps for gate electrodes according to the invention.

FIGS. 8A and 8B show other examples of the invention.

FIGS. 10A through 10C show the formation steps for prior art gate electrodes.

DESCRIPTION OF THE PREFERRED EMBODIMENTS

Figure 1:
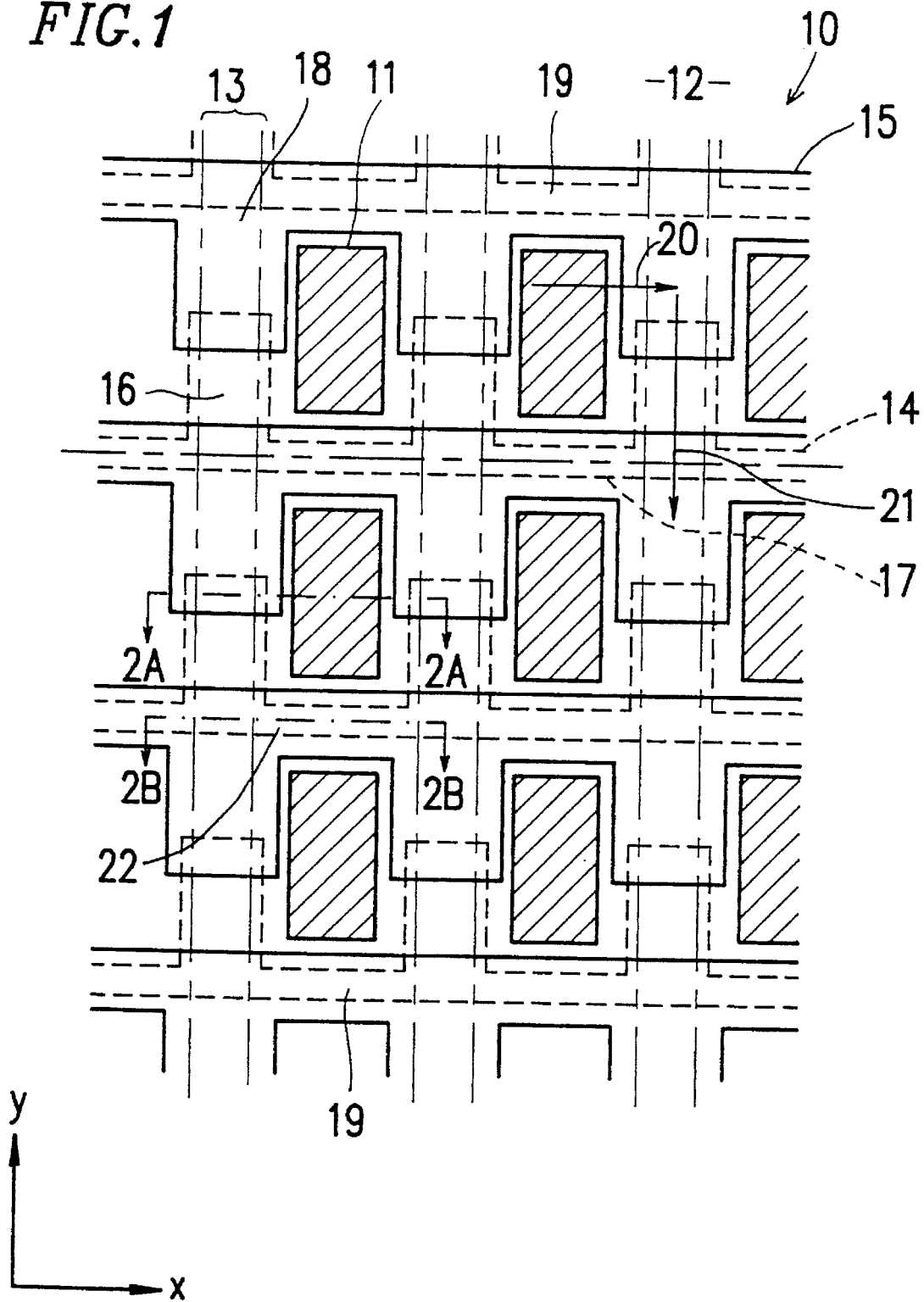
FIG. 1 shows a partial plan view of a solid state image device of the invention.

FIG. 1 shows, in part, a schematic plan view of a solid state image device 10 of the invention. Note that for clarity FIG. 1 does not show all of the components necessary for a solid state image device. The solid state image device 10 includes a semiconductor substrate 12, and photodiodes 11 formed in a matrix pattern along the x and y directions in the semiconductor substrate 12. The photodiodes 11 function as photoelectric converting elements which receive light and convert it into electric charges. Vertical transfer regions 13 extending along the y direction are formed between the photodiodes 11 in the semiconductor substrate 12. Each of the vertical transfer regions 13 is adjacent to a photodiode 11 and transfers an electric charge generated in the photodiode 11 toward the y direction. The regions where the photodiode 11 and the vertical transfer region 13 are provided are referred to as a photoelectric transfer region and a vertical transfer region, respectively. The region between two adjacent photoelectric transfer portions along the y direction is referred to as a clip portion.

The solid state image device 10 further includes a plurality of first gate electrodes 14 and a plurality of second gate electrodes 15, both in a comb shape, over the semiconductor substrate Each of the first gate electrodes 14 includes transfer electrode portions 16 provided over the vertical transfer regions 13, and clip electrode portions 17 for connecting the transfer electrode portions 16 to each other along the x direction. Similarly, each of the second gate electrodes 15 includes transfer electrode portions 18 provided over the vertical transfer regions 13, and clip electrode portions 19 for connecting the transfer electrode portions 16 to each other along the x direction. The transfer electrode portions 16 partially overlap with the transfer electrode portions 17.

After electric charges are accumulated in the photodiodes 11, each of the electric charges is transferred to the vertical transfer region 13 as indicated with an arrow 20 in accordance with driving pulse voltages applied to the second gate electrodes 15. Then, the electric charge is transferred in the vertical transfer region 13 in the direction indicated by an arrow 21 by driving pulse voltages applied to the first gate electrodes 14 and the second gate electrodes 15.

Figure 2C:
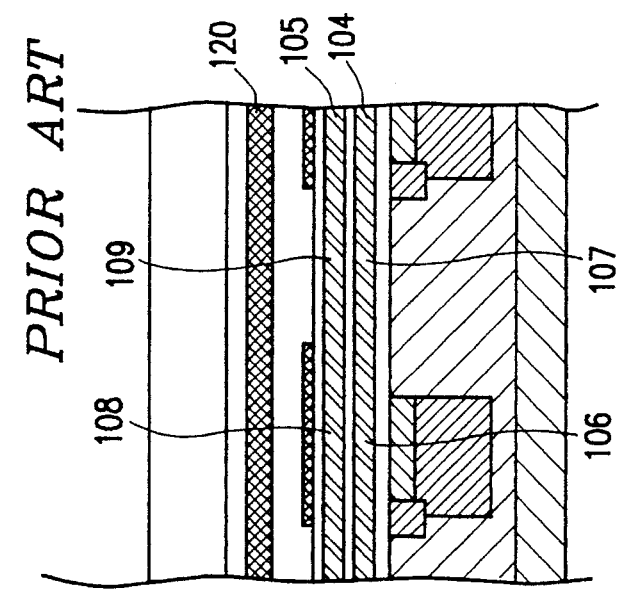
FIG. 2C illustrates a cross sectional view taken along Line 2C—2C of the conventional solid state image device shown in FIG. 9.
Figure 2B:
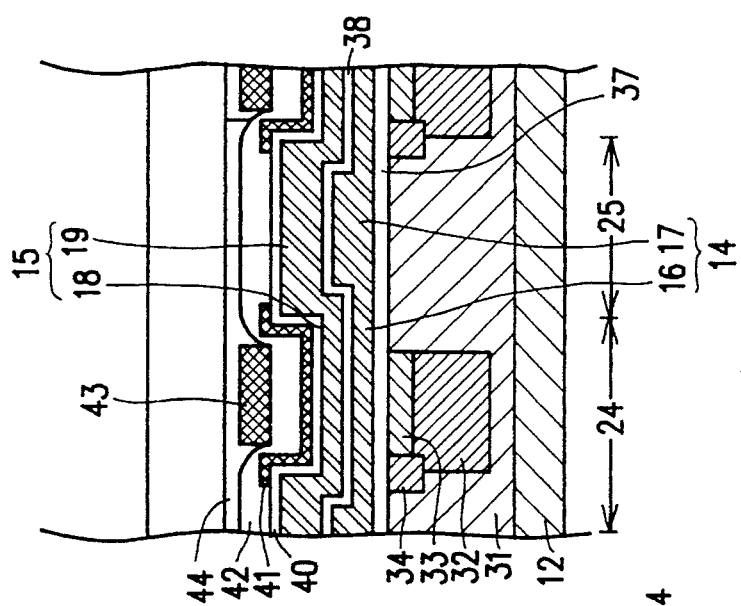
FIG. 2B illustrates a cross sectional view taken along Line 2B—2B of the solid state image device shown in FIG. 1.
Figure 2A:
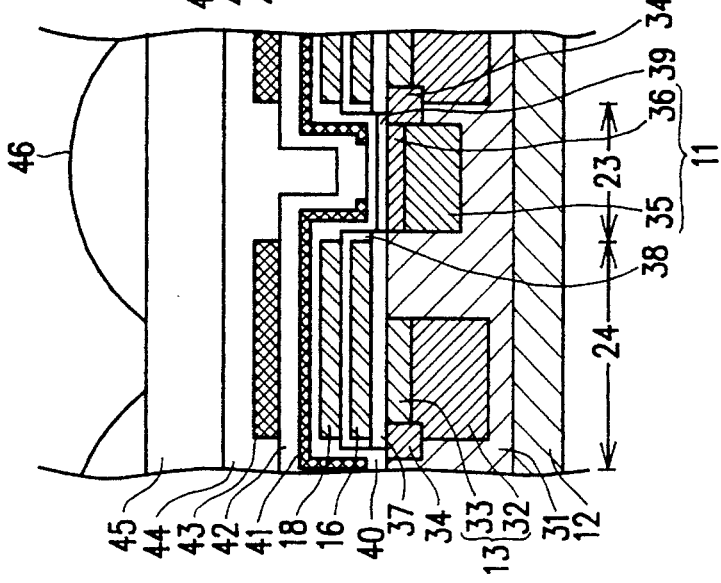
FIG. 2A illustrates a cross sectional view taken along Line 2A—2A of the solid state image device shown in FIG. 1.
Figure 9:
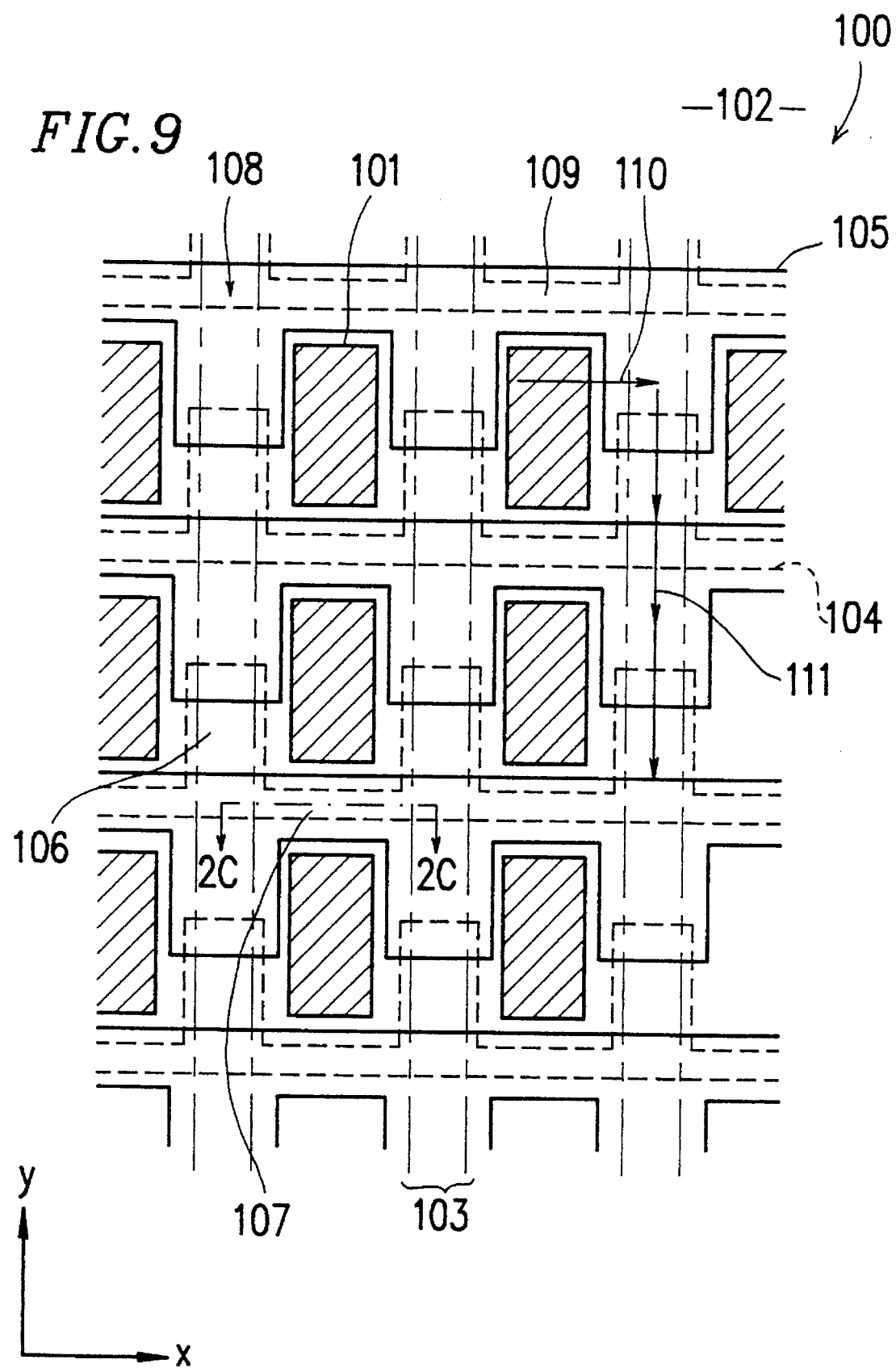
FIG. 9 shows a partial plan view of a conventional solid state image device.

FIGS. 2A and 2B illustrate the cross sectional views taken along Line 2A—2A and Line 2B—2B of the solid state image device 10 shown in FIG. 1, respectively. The cross section taken along Line 2A–2A shows the photoelectric transfer portion 23 including the photodiode 11, and a vertical transfer portion 24 including the vertical transfer region 13. The cross section taken along Line 2B—2B shows the vertical transfer portion 24 and a clip portion 25. A cross section taken along Line 2C—2C of the conventional solid state image device 100 illustrated in FIG. 9 is shown for a comparison.

As shown in FIG. 2A, a P⁻ well layer 31 is formed at the surface of the semiconductor substrate 12 made of N-type silicon. A first diffusion layer 32 (P layer) is formed in the P⁻ well layer 31. A second diffusion layer 33 (N layer) and a third diffusion layer 34 (P⁺ layer) are formed on the first diffusion layer 32 (N layer). The first and second diffusion layers 32 and 33 constitute the transfer region 13.

Adjacent to the third diffusion layer 34, a fourth diffusion layer 35 (N layer) is formed in the P⁻ well layer 31, and the fifth diffusion layer 36 (P⁺ layer) is formed on the fourth diffusion layer 35. The fourth and fifth diffusion layers 35 and 36 constitute the photodiode 11.

A first insulating film 37 is formed so as to cover the second diffusion layer 33 (N layer) and part of the third diffusion layer 34 (P⁺ layer). The transfer electrode portion 16 of the first gate electrode 15 is provided on the first insulating film 37. The transfer electrode portion 16 is made of polysilicon. A second insulating film 38 is formed so as to cover the transfer electrode portion 16.

A third insulating film 39 is formed over the fifth diffusion layer 36 (P⁺ layer). The transfer electrode portion 18 of the second gate electrode 14 is formed on the second insulating film 38 which is formed so as to cover the transfer region 13. The transfer electrode portion 18 is made of polysilicon.

A fourth insulating film 40 is formed over the entire semiconductor substrate 12. A first light shielding metal 41 is formed on the fourth insulating film 40 of the vertical transfer portion 24.

Furthermore, a fifth insulating film 42 is formed over the entire semiconductor substrate 12. A second light shielding metal film 43 is formed on the fifth insulating film 42 of the vertical transfer portion 13.

A flattening film 44 is formed with an acrylic resin or the like over the entire semiconductor substrate 12. A color filter layer 45 is formed on the flattening film 44. A microlens 46, which corresponds to each of the photoelectric transfer portions 11 on the color filter layer 45, is provided.

As shown in FIG. 2B, the structure of the vertical transfer portion 24 is the same as that shown in the cross sectional view shown in FIG. 2A. In the clip portion 25, the photodiode 11 is not formed, and only a P⁻well layer 31 is formed at the semiconductor substrate 12. The first insulating film 37 is formed on the vertical transfer portion 24 and the clip portion 25. The third insulating film 39 is formed on the photoelectric transfer portion 11. The transfer electrode portion 16 and a clip electrode portion 17 are formed in the vertical transfer portion 24 and the clip portion 25, respectively, through the first insulating film 37. The transfer electrode portion 16 and the clip electrode portion 17 constitute a part of a continuous first gate electrode 14. The transfer electrode portion 16 and the clip electrode portion 17 are made of polysilicon, and the clip electrode portion 17 is formed so as to be thicker than (approximately twice as thick as) the transfer electrode portion 16. A second insulating film 38 is formed so as to cover the first gate electrode 14.

Moreover, a transfer electrode portion 18 and the clip electrode portion 19 are formed on the second insulating film 38 in the vertical transfer portion 24 and the clip portion 25, respectively. The transfer electrode portion 18 and the clip electrode portion 19 constitute a continuous second gate electrode 15. The transfer electrode portion 18 and the clip electrode portion 19 are made of polysilicon, and the clip electrode portion 19 is formed so as to be thicker than (approximately twice as thick as) the transfer electrode portion 18. A fourth insulating film 40 is formed so as to cover the second gate electrode 15.

A first light shielding metal film 41 is formed on the fourth insulating film 40 in the vertical transfer portion 24. A fifth insulating film 42 is further formed over the entire semiconductor substrate 12. A second light shielding metal film 43, having a region which is approximately as wide as the vertical transfer portion 24, is formed on the fifth insulating film 42 on the first light shielding metal film 41.

A flattening film 44 made of an acrylic resin or the like is formed over the entire semiconductor substrate 12. The surface of the flattening film 44 is flattened. Then, a color filter layer 45 is formed on the flattening film 44 in this order. As is understood from FIGS. 1 and 2B, the microlens 46 is not shown in FIG. 2B. This is because the microlens 46 is formed above each of the photodiodes 11 and is not positioned above the just middle portion between two adjacent photodiodes 11.

In the first and second gate electrodes 104 and 105 of the conventional solid state image device 100 shown in FIG. 2C, the transfer electrode portions 106 and 108 have the same thickness as that of the clip electrode portions 107 and 109. The second light shielding metal film 120 is formed in both of the transfer portion and the clip portion.

As shown in FIGS. 2A and 2B, in the solid state image device 10 of the invention, the thicknesses of the first and second gate electrode portions 14 and 15 in the vertical transfer portion 24 are different from those in the clip portion 25. Specifically, the thicknesses of the clip electrode portions 17 and 19 in the clip portion 25 are thicker than those of the transfer electrode portions 16 and 18 in the vertical transfer portion 24.

Moreover, in the solid state image device 10 of the invention, the first and second light shielding metal films 41 and 43 are formed only in the vertical transfer portion 24.

Therefore, the difference in the level between the clip electrode portions 17 and 19, and the transfer electrode portions 16 and 18, due to the different film thicknesses can be reduced by providing the first and second light shielding metal films 41 and 43 only in the vertical transfer portion 24. Thus, the height from the surface of the semiconductor substrate 12 to the surface of the flattening film 44 does not become too high, and the distance between the microlens 46 and the photodiode 11 does not become longer than that of conventional elements.

The solid state image device 10 of the invention will be described below by means of specific examples.

Figure 3A:
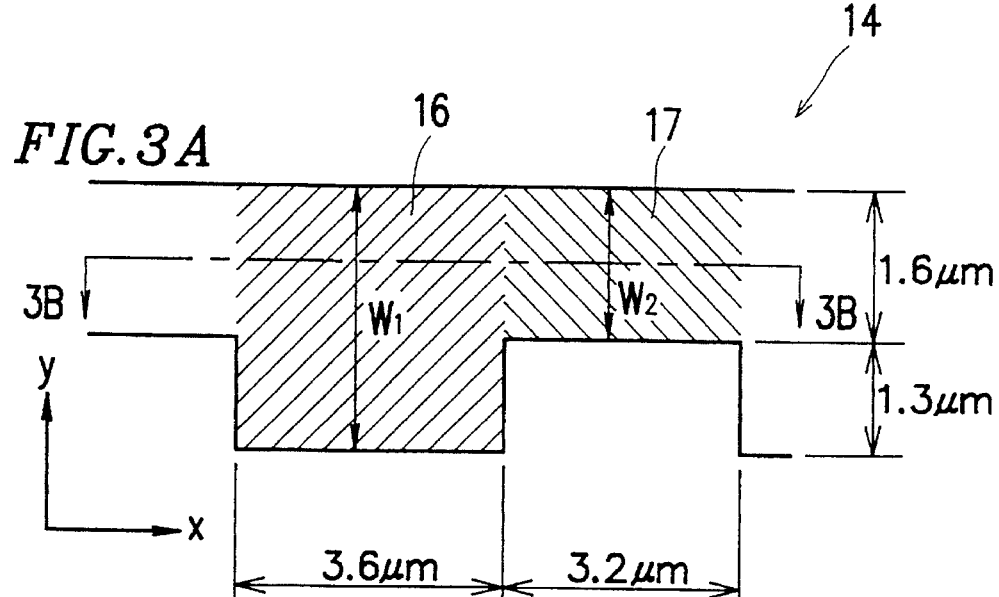
FIG. 3A shows an example of a gate electrode structure.
Figure 3B:
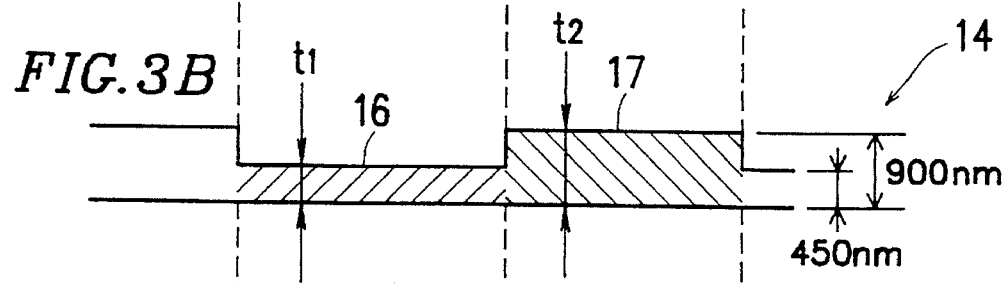
FIG. 3B shows a cross sectional view taken along Line 3B—3B in FIG. 3A.

FIG. 3A shows a partial plan view of the surface area of the first gate electrode 14, made of polysilicon, used in the solid state image device 10. FIG. 3B is a cross sectional view taken along 3B—3B in FIG. 3A.

As shown in FIG. 3A, the transfer electrode portion 16 is a rectangular area of 3.6 μm×2.9(1.3+1.6) μm. The clip electrode portion 17 is a rectangular area of 3.2 μm×1.6 μm. As shown in FIG. 3B, the transfer electrode portion 16 and the clip electrode portion 17 have thicknesses of 450 nm and 900 nm, respectively. Since the width w2 of the clip electrode portion 17 is smaller than the width w1 of the transfer electrode portion 16, the resistance of the clip electrode portion 17 is higher than that of the transfer electrode portion 16. However, the thickness t2 of the clip electrode portion 17 is larger than the thickness t1 of the transfer electrode portion 16, the increase in the resistance of the gate electrode in the clip portion 17 thereby being prevented.

Figure 3C:
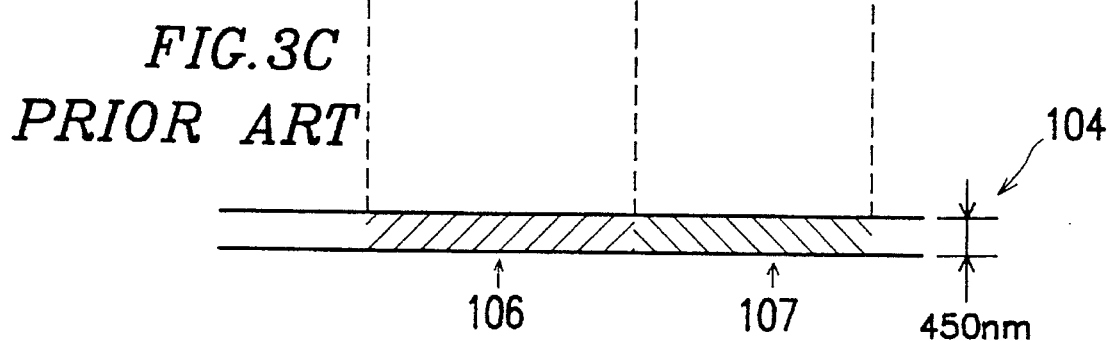
FIG. 3C shows a cross sectional view of a conventional gate electrode.

The resistance of the clip electrode portion 17 decreases as the thickness thereof increases, and thus, the thicker clip electrode portion 17 is preferable. However, if the clip electrode portion 17 is too thick, the height of the clip portion 25 from the semiconductor substrate 12 is greater than that of the vertical transfer portion 24, before the flattening film 44 is formed. In this case, the distance between the microlens 46 and the semiconductor substrate 12 becomes longer. Therefore, it is preferable that the thickness ratio of the transfer electrode portion 16 and the clip electrode portion 17 is 1 to 2. When the gate electrodes of the conventional solid state image device 100 have the size of the surface area as shown in FIG. 3A, and when both of the transfer electrode portion 106 and the clip electrode portion 107 have the thickness of 450 nm, as shown in FIG. 3C, the resistance of the first gate electrode 14 decreases to about 70% of the value in the conventional element.

In the solid state image device of the invention, the shape of the surface area of the gate electrode may be similar to that in the conventional element. Thus, since the surface area of the clip electrode portion does not increase and part of the photoelectric transfer portion is not covered by the clip electrode portion, the incident light into the photodiode does not decrease.

In addition, the gate electrodes of the invention consist of a single polysilicon layer. On the contrary, in order to reduce the resistance of the gate electrodes, a multilayer construction including a polysilicon film and tungsten silicide film may by used, for example. In that case, however, the tungsten silicide film tends to peel off from the polysilicon film during oxidation after forming the gate electrodes. Also, there arises a problem that the polysilicon film is etched faster than the tungsten silicide film. According to the present invention, such problems do not arise.

Figure 4:
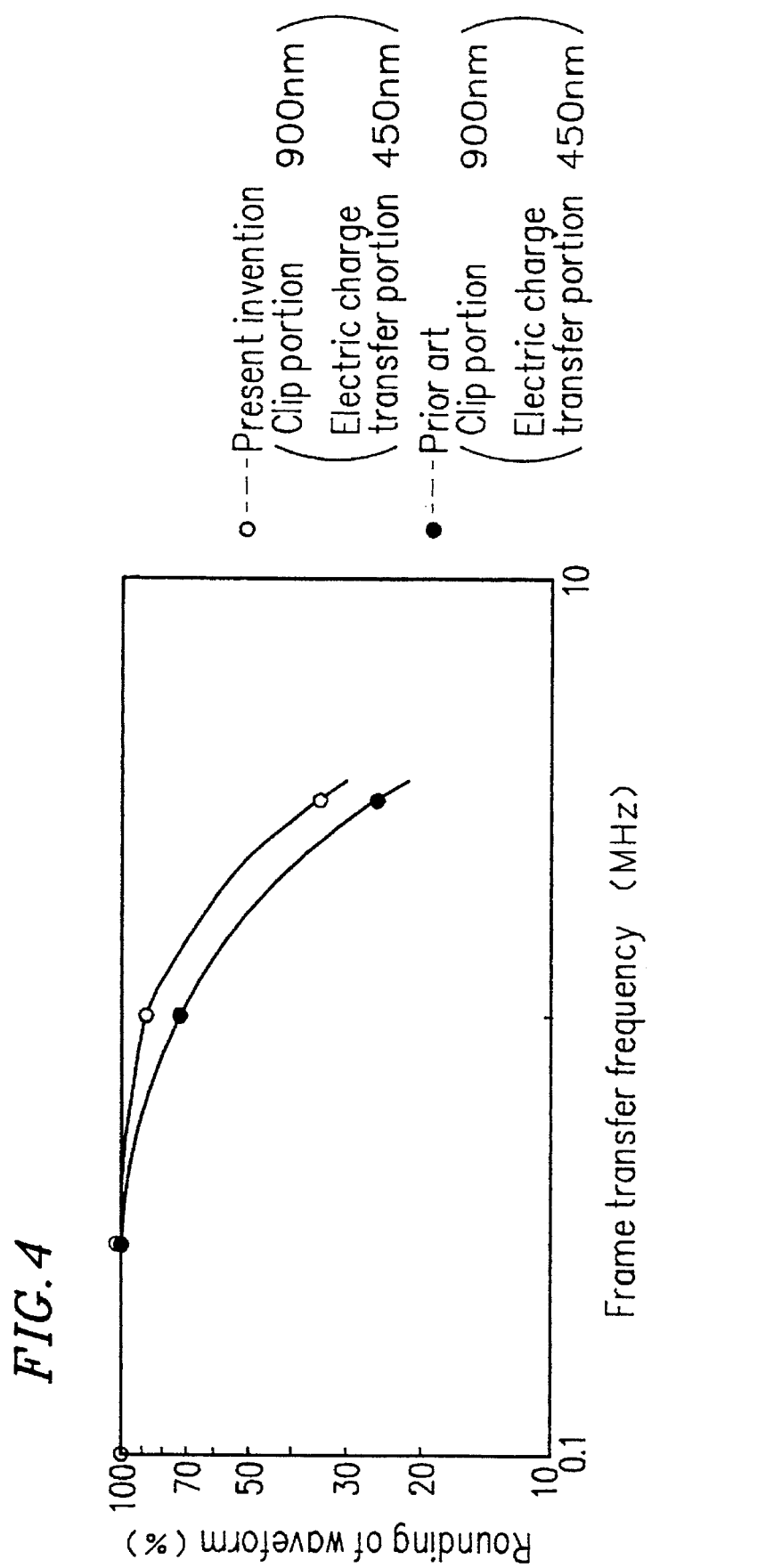
FIG. 4 is a graphic representation illustrating the relationship between the frame transfer frequency and the rounding of the waveform.

Since the resistance of the gate electrode decreases, the rounding of a pulse waveform voltage is suppressed. FIG. 4 shows the relationship between frame transfer frequency and the rounding (potential drop) of the pulse waveform when the pulse waveform voltage is applied to the gate electrode shown in FIG. 3. The white dots show the result of the invention, and the black dots show the result of the conventional art. As shown in FIG. 4, the rounding in the pulse is suppressed more significantly than with the conventional art as the frequency of the waveform becomes higher. For instance, when a pulse waveform of 300 kHz is applied to the gate electrode, the voltage decreases to about 98.2% with the conventional art. However, the voltage decreases only to about 99.6% according to the invention. Thus, the rounding of the driving pulse voltage is suppressed, and the maximum amount of electric charge transfer is improved.

The distance between the photoelectric transfer portion and the microlens will be discussed below.

As described above referring to FIGS. 2A and 2B, the increase in the thickness of the gate electrode occurring only in the clip portion of the solid state image device of the invention is balanced by not providing a light shielding metal film at the clip portion. Thus, as shown in FIG. 5B, the distance r between the photodiode 11 and the microlens 46 in the solid state image device of the invention is approximately equal to that of the conventional solid state image device. However, if the film thickness of the whole gate electrode 50 is made thicker to reduce the resistance of the gate electrode, the distance between the microlens 51 and the photodiode 52 disadvantageously becomes longer as shown in FIG. 5A.

Figure 5A:
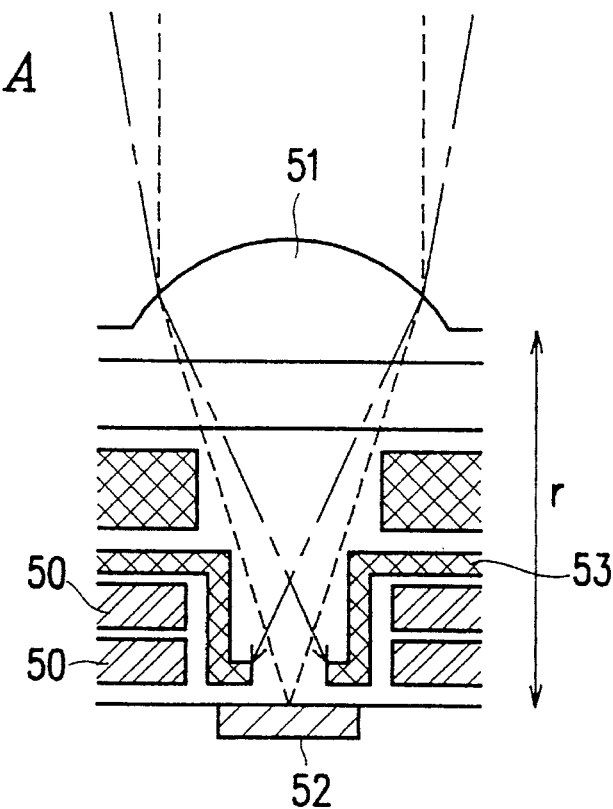
FIGS. 5A and 5B show the differences in incident light paths depending on the distance between the photodiode and the microlens.
Figure 5B:
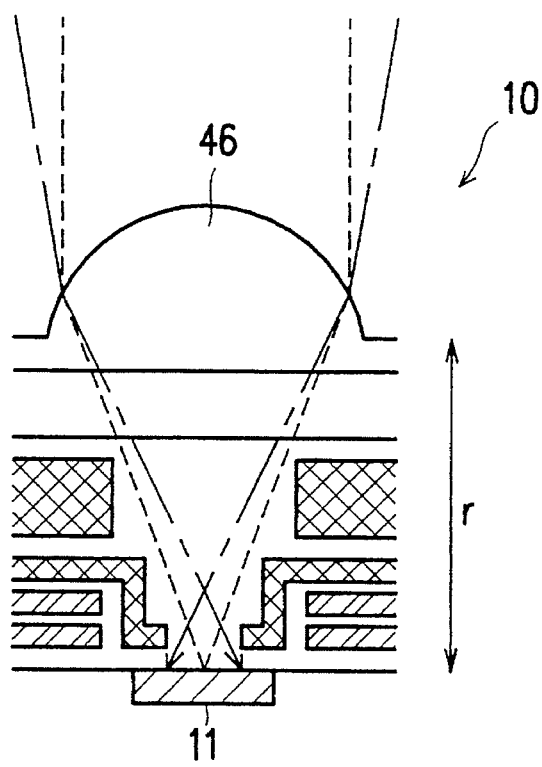

FIGS. 5A and 5B show the incident light into the microlens. The broken lines indicate parallel light. The one-dot chain lines indicate non-parallel light.

AS shown in FIG. 5A, since the distance r is long, the curvature of the microlens 51 needs to be smaller than that of the example shown in FIG. 5B in order to adjust the focal point of the microlens 51 onto the photodiode 52. In this case, when the incident light is non-parallel, the incident light is shielded by the light shielding metal film 53, and the light received by the photodiode 52 thereby decreases.

According to the solid state image device 10 of the invention, on the other hand, even when the incident light is non-parallel, the light received by the photodiode 11 does not decrease since the distance r does not increase.

Figure 6:
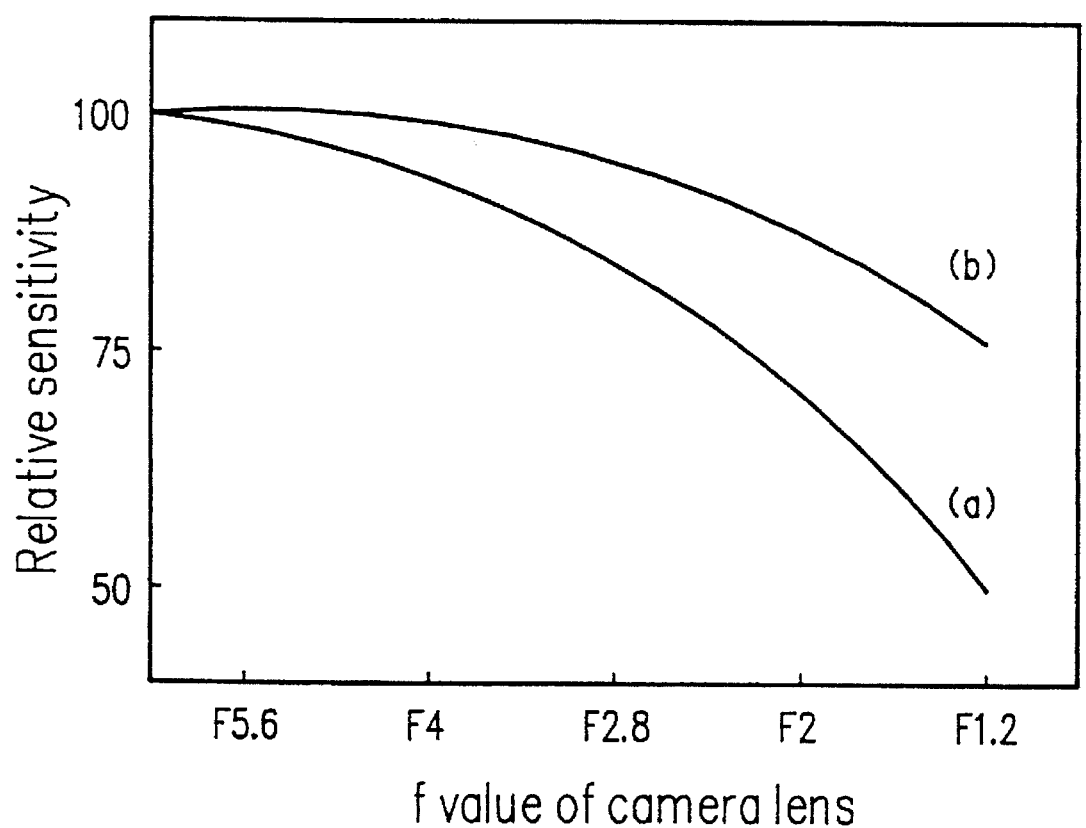
FIG. 6 shows the change of the relative sensitivity with regard to the f value of a camera lens.

FIG. 6 shows the change of the relative sensitivity with regard to the f value of a camera lens when the solid state image device is used in a camera. As the f value of the camera lens decreases, incident light becomes non-parallel. Thus, when the distance r between the microlens 51 and the photodiode 52 is long as shown in FIG. 6, the relative sensitivity decreases significantly as the f value decreases, as shown by Curve (a). However, according to the invention, since the distance between the microlens 46 and the photodiode 11 does not change from that in the conventional element, the reduction of the relative sensitivity is suppressed, as shown by Curve (b), even when the f value becomes smaller.

A production method for the solid state image device 10 of the invention will be described below.

AS shown in FIGS. 2A and 2B, boron ions are implanted in the N-type semiconductor substrate 12, and the semiconductor substrate 12 is annealed to form a P⁻ well layer. Then, a resist pattern (not shown) is formed on the P⁻ well layer 31. Boron ions are implanted using the resist pattern as a mask to form a P-type barrier well as the first diffusion layer 32.

Then, phosphorus ions are implanted using the resist pattern to form the second diffusion layer 33 (N layer) over the entire semiconductor substage 10.

After removing the resist pattern, the first insulating film 37 is formed so as to cover the second diffusion layer 33 (N layer) over the entire semiconductor substrate 10.

Another resist pattern (not shown) is formed on the first insulating film 37. Boron ions are implanted using the resist pattern to form the third diffusion layer 34 (P⁺ layer). The resist pattern is removed after that.

FIGS. 7A through 7E show steps of forming the first and second gate electrodes 14 and 15. In each of FIGS. 7A through 7B, a partial plan view, a cross sectional view taken along Line a–a' in the partial plan view, and a cross sectional view taken along Line b–b' in the partial plan view are shown.

As shown in FIG. 7A, a polysilicon film 61 having a thickness of 900 nm is deposited on the first insulating film 37. As shown in FIG. 7B, a resist pattern 62 to define the first gate electrode is formed on the polysilicon film 61. Then, the polysilicon film 61 is etched, using the resist pattern 62 as a mask, till the insulating film 37 is exposed (FIG. 7C).

After removing the resist pattern 62, as Shown in FIG. 7D, a resist pattern 63, which covers the regions except the region becoming the transfer electrode portion 16, is formed on part of the first insulating film 37 and on part of the polysilicon film 61.

Next, the polysilicon film 61 is etched until it reaches a thickness of 450 nm, using the resist pattern 63 as a mask. This process etches only the portion becoming the transfer electrode portion 16 in the polysilicon film 61.

By removing the resist pattern 63, as shown in FIG. 7E, the first gate electrode 14 is formed. The first gate electrode 14 includes the transfer electrode portion 16 of about 450 nm thick and the clip electrode portion 17 of about 900 nm thick.

Referring to FIGS. 2A and 2B again, after the surface of the first gate electrode 14 is oxidized to form the second insulating film 38, the second gate electrode 15 is formed using the same process for the first gate electrode 14. Using the first and second gate electrodes 14 and 15 as masks, part of the first insulating film 37 is removed.

Then, after the third insulating film 39 is formed on the photoelectric transfer portion 11 by oxidation, a resist pattern (not shown) to define the photoelectric transfer portion 11 is formed on the third insulating film 39. Phosphorus ions are implanted to form the fourth diffusion layer 35 (N layer).

After removing the resist pattern, boron ions are implanted, using the first and second gate electrodes 14 and 15 as masks, to form the fifth diffusion layer 36 ($P^+$ layer) on the surface of the fourth diffusion layer 35. The fourth insulating film 40 is formed so as to cover the second gate electrode 15 over the entire semiconductor substrate 12.

Next, the first light shielding metal film 41 is formed on the fourth insulating film 40 in the vertical transfer portion 24. After the deposition of the fifth insulating film 42 covering the first light shielding metal film 41, the second light shielding metal film 43 is formed only in the vertical transfer portion 24. As a result, even if the first and second gate electrodes 14 and 15 are made thicker only in the clip portion 25, since the light shielding metal film 41 and 43 are not formed in the clip portion 25, the height of the clip portion 25 from the semiconductor substrate 12 is not greater than that of the vertical transfer portion 24.

Then, the flattening film 44 is formed by applying an acrylic resin or the like over the entire semiconductor substrate 12, and the color filter layer 45 is formed on the flattening film 44. Finally, the microlens 46 having its center above the photodiode 11 is formed.

Although the first and second gate electrodes are made thicker in the clip portion, only one electrode may be made thicker. For instance, as shown in FIG. 8A, the thickness of a clip electrode portion 72 in the clip portion 25 of the first gate electrode 71 may be thicker than that of a transfer electrode portion 73 in the vertical transfer portion 24, and the thickness of a clip electrode portion 76 and that of a transfer electrode portion 77 may be the same.

Alternatively, as shown in FIG. 8B, the thickness of a clip electrode portion 82 in the clip portion of the second gate electrode 81 may be thicker than that of a transfer electrode portion 83, and the thickness of a clip electrode portion 86 and that of a transfer electrode portion 87 may be the same.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A solid state image device comprising:

a plurality of photoelectric converting elements arranged in a matrix pattern along a first and a second direction in a semiconductor substrate;

a plurality of electric charge transfer regions for receiving electric charges from the photoelectric converting elements and for transferring the electric charges toward the first direction, the electric charge transfer regions being provided adjacent the plurality of photoelectric converting elements in the semiconductor substrate and extending along the first direction;

a plurality of gate electrodes for applying a voltage to the electric charge transfer regions to transfer the electric charge from the photoelectric converting elements to the electric charge transfer regions, and to transfer the electric charges toward the first direction, each of the gate electrodes having:

a plurality of transfer electrode portions provided over the electric charge transfer regions;

a plurality of clip electrode portions electrically connecting the plurality of the transfer electrode portions to each other along the second direction, the plurality of the clip electrode portions having a greater thickness than that of the plurality of the transfer electrode portions such that a thickness ratio of the clip electrode portions and the transfer electrode portions is substantially two-to-one; and light shielding means, provided over only the electric charge transfer regions, for shielding the electric charge transfer regions from incident light, wherein a distance, between the semiconductor substrate and a top surface of the clip electrode portions, is equal to or smaller than a distance between the semiconductor substrate and a top surface of the light shielding means.

2. A solid state image device according to claim 1, wherein the gate electrodes are made of a single layer of polysilicon.

3. A solid state image device according to claim 1, wherein an increase in the thickness of the clip electrode portions is substantially avoided by not providing the light shielding means over the clip electrode portions.

4. A solid state image device according to claim 1, wherein the plurality of gate electrodes includes a plurality of first gate electrodes and a plurality of second gate electrodes.

5. A solid state image device according to claim 1, further comprising a plurality of microlenses, formed over the plurality of photoelectric converting elements.

6. A method of producing a solid state image device, having a plurality of photoelectric converting elements arranged in a matrix pattern along a first and a second direction in a semiconductor substrate, comprising the steps of:

forming a plurality of electric charge transfer regions for receiving electric charges from the photoelectric converting elements and for transferring the electric charges toward the first direction, the electric charge transfer regions being provided adjacent to the plurality of photoelectric converting elements in the semiconductor substrate and extending along the first direction; and forming a plurality of gate electrodes for applying a voltage to the electric charge transfer regions to transfer the electric charge from the photoelectric converting elements to the electric charge transfer regions, and to transfer the electric charges toward the first direction, each of the gate electrodes having a plurality of transfer electrode portions, provided over the electric charge transfer regions, and a plurality of clip electrode portions electrically connecting the plurality of the transfer electrode portions to each other along the second direction, the plurality of the clip electrode portions having a greater thickness than that of the plurality of the transfer electrode portions, wherein the step of forming the gate electrodes includes the steps of:

forming a polysilicon film, having a pattern of the gate electrodes, on the semiconductor substrate;

forming a resist pattern over an entire surface of the semiconductor substrate, except regions of the polysilicon film which are intended to be the transfer electrode portions;

etching the polysilicon film, using the resist pattern as a mask;

forming a metal film over the entire surface of the semiconductor substrate; and forming a light shielding metal film by etching the metal film so that portions of the metal film remain only over the plurality of electric charge transfer regions, whereby a distance between the semiconductor substrate and a top surface of the clip electrode portions is equal to or smaller than a distance between the semiconductor substrate and a top surface of the light shielding metal film.

7. A method of producing a solid state image device, having a plurality of photoelectric converting elements arranged in a matrix pattern along a first and a second direction in a semiconductor substrate, comprising the steps of:

forming a plurality of electric charge transfer regions for receiving electric charges from the photoelectric converting elements and for transferring the electric charges toward the first direction, the electric charge transfer regions being provided adjacent to the plurality of photoelectric converting elements in the semiconductor substrate and extending along the first direction;

forming a first polysilicon film over an entire surface of a semiconductor substrate;

forming a plurality of first gate electrodes by etching the first polysilicon film, each of the first gate electrodes having a plurality of transfer electrode portions, provided over the electric charge transfer regions, and a plurality of clip electrode portions, electrically connecting the plurality of the transfer electrode portions to each other along the second direction, the plurality of the clip electrode portions having a greater thickness than that of the plurality of transfer electrode portions;

forming a second polysilicon film over the entire surface of a semiconductor substrate and the plurality of first gate electrodes;

forming a plurality of second gate electrodes by etching the second polysilicon film, each of the second gate electrodes having a plurality of transfer electrode portions, provided over the electric charge transfer regions, and a plurality of clip electrode portions, electrically connecting the plurality of the transfer electrode portions to each other along the second direction, the plurality of the clip electrode portions having a greater thickness than that of the plurality of transfer electrode portions, each of the transfer electrode portions of the second gate electrodes partially overlapping the corresponding transfer electrode portion of the second gate electrodes;

forming a metal film over the entire surface of the semiconductor substrate; and forming a light-shielding metal film by etching the metal film, so that portions of the metal film remain only over the plurality of electric charge transfer regions, whereby a distance between the semiconductor substrate and a top surface of the clip electrode portions is equal to or smaller than a distance between the semiconductor substrate and a top surface of the light shielding metal film, wherein the step of forming the plurality of first gate electrodes includes the steps of:

forming a first resist pattern on the first polysilicon film, the first resist pattern having a pattern defining the plurality of first gate electrodes;

etching the first polysilicon film using the first resist pattern as a mask;

forming a second resist pattern on portions of the remaining first polysilicon film, namely those portions intended to be the plurality of clip electrode portions; and etching the remaining first polysilicon film, using the second resist pattern as a mask, and wherein the step of forming the plurality of second gate electrodes includes the steps of:

forming a third resist pattern on the second polysilicon film, the third resist pattern having a pattern defining the plurality of second gate electrodes;

etching the second polysilicon film, using the third resist pattern as a mask;

forming a fourth resist pattern on portions of the remaining second polysilicon film, namely those portions intended to be the plurality of clip electrode portions; and etching the remaining second polysilicon film, using the fourth resist pattern as a mask.

* * * * *